(12) United States Patent
Zanchi

(10) Patent No.: US 10,704,969 B2
(45) Date of Patent: Jul. 7, 2020

(54) STRESS SENSOR

(71) Applicant: The Boeing Company, Chicago, IL (US)

(72) Inventor: Alfio Zanchi, Huntington Beach, CA (US)

(73) Assignee: THE BOEING COMPANY, Chicago, IL (US)

( * ) Notice: Subject to any disclaimer, the term of this patent is extended or adjusted under 35 U.S.C. 154(b) by 244 days.

(21) Appl. No.: 15/819,688

(22) Filed: Nov. 21, 2017

(65) Prior Publication Data

US 2019/0154527 A1    May 23, 2019

(51) Int. Cl.
*G01L 1/22* (2006.01)
*G01L 9/00* (2006.01)
*G01F 1/44* (2006.01)
*H01G 5/16* (2006.01)
*H01L 27/06* (2006.01)
(Continued)

(52) U.S. Cl.
CPC .............. *G01L 1/2293* (2013.01); *G01F 1/44* (2013.01); *G01L 1/2262* (2013.01); *G01L 9/0042* (2013.01); *G01L 9/0051* (2013.01); *H01G 5/16* (2013.01); *H01L 27/0629* (2013.01); *H01L 29/93* (2013.01); *H01L 29/94* (2013.01); *H03F 3/45179* (2013.01); *H03L 7/099* (2013.01); *H03F 2200/129* (2013.01); *H03F 2200/156* (2013.01); *H03F 2200/228* (2013.01); *H03F 2200/267* (2013.01); *H03F 2200/481* (2013.01);
(Continued)

(58) Field of Classification Search
CPC combination set(s) only.
See application file for complete search history.

(56) References Cited

U.S. PATENT DOCUMENTS 5,419,199 A * 5/1995 Araki ..................... G01L 9/065
73/708
9,405,305 B1    8/2016 Zanchi
(Continued)

FOREIGN PATENT DOCUMENTS

EP    3032235 A1    6/2016

OTHER PUBLICATIONS

Chimmalagi, Rajashekhar, "GF14LPP-XL AMS Reference Flow for FINFET Technology", GlobalFoundries, Apr. 5, 2016, 42 pp.
(Continued)

*Primary Examiner* — Vincent Q Nguyen
(74) *Attorney, Agent, or Firm* — Armstrong Teasdale LLP

(57) ABSTRACT

A stress sensor is provided, including a substrate and a bridge circuit disposed thereon. The bridge circuit is coupled between an output node and a ground node. The bridge circuit includes a first branch and a second branch, the first having a first resistor, R1, having a first orientation and coupled to a tuning resistor, Rtune, at a first intermediate node. The second branch includes a second resistor, R2, having a second orientation that is different from the first orientation, and coupled to a variable resistor, Rvar, at a second intermediate node. The bridge circuit includes an amplifier having a positive input terminal coupled to the second intermediate node, and a negative input terminal coupled to the first intermediate node. The amplifier generates a voltage output at the output node as a function of mechanical stress applied to the substrate. Rvar is non-linearly tunable based on the voltage output.

22 Claims, 13 Drawing Sheets

(51) Int. Cl.
*H01L 29/93* (2006.01)
*H01L 29/94* (2006.01)
*H03F 3/45* (2006.01)
*H03L 7/099* (2006.01)

(52) U.S. Cl.
CPC ............... *H03F 2203/45116* (2013.01); *H03F 2203/45514* (2013.01); *H03F 2203/45526* (2013.01)

(56) References Cited

U.S. PATENT DOCUMENTS

| | | | |
|---|---|---|---|
| 2009/0309569 A1 | 12/2009 | Schulz | |
| 2013/0314068 A1 | 11/2013 | Zhen et al. | |
| 2015/0177281 A1* | 6/2015 | Jourdan | G01R 33/0206 |
| | | | 324/706 |
| 2017/0261567 A1* | 9/2017 | Cesaretti | G01R 33/0082 |

OTHER PUBLICATIONS

Kuenen, Jeroen C. et al., "Measurement of Dielectric Absorption of Capacitors and Analysis of its Effects on VCO's", IEEE Transactions on Instrumentation and Measurement, vol. 45, No. 1, Feb. 1996, pp. 89-97.

Bardon, M. Garcia et al., Layout-induced Stress Effects in 14nm & 10nm FinFETs and their Impact on Performance, 2013 Symposium on VLSI Technology Digest of Technical Papers, pp. T114-T115.

Ahuja, Bhupendra K. Ahuja et al., "A Very High Precision 500-nA CMOS Floating-Gate Analog Voltage Reference," IEEE Journal of Solid-State Circuits, vol. 40, No. 12, Dec. 2005, pp. 2364-2372.

Brokaw, A. Paul, "A Simple Three-Terminal IC Bandgap Reference," IEEE Journal of Solid-State Circuits, vol. SC-9, No. 6, Dec. 1974, pp. 388-393.

Widlar, Robert J., "New Developments in IC Voltage Regulators", IEEE Journal of Solid-State Circuits, vol. SC-6, No. 1, Feb. 1971, pp. 2-7.

"Practical Strain Gage Measurements", Hewlett-Packard, Application Note AN290-1, Sep. 1981, 32 pp.

Lee, Mitchell, "Understanding and Applying Voltage References", Linear Technology, Application Note 82, Nov. 1999, 12 pp.

Mian, Ahsan et al., "The van der Pauw Stress Sensor", IEEE Sensors Journal, vol. 6, No. 2, Apr. 2006, 17 pp.

Extended European Search Report regarding European Patent Application No. 18207165.4 dated Apr. 15, 2019, pp. 1-8.

* cited by examiner

STRESS SENSOR

BACKGROUND

The field of the disclosure relates generally to stress sensors, and more specifically to a stress sensor including a bridge circuit configured for stress monitoring.

Many electrical systems are implemented in or include electronic circuits fabricated on semiconductor wafers, including, for example, and without limitation, Silicon wafers. The processing and packaging of semiconductor wafers sometimes introduces mechanical stress on the dice cut from the wafers themselves, due to the sawing operation itself or the subsequent molding process to enclose the dice inside a package. Such stresses may impact performance of the electrical system, its circuits and its structures. For example, post-packaging stress has a notable effect on the precision of analog-to-digital converters, digital-to-analog converters, and voltage reference circuits. Such stresses may further impact the carrier mobility in transistors implemented on the wafer. Accordingly, stress sensors are often incorporated into electronic circuits to characterize mechanical stresses that act on the larger circuit, or system on a chip (SoC).

Conventionally, such sensors include van der Pauw resistor structures or rosette arrangements, for example, in which stresses applied to semiconductor wafers, or substrates, are sensed by variations in capacitance or resistance of particular components of the sensor circuits. Substrates are solid surfaces, or wafers, usually planar, on which an electronic circuit is implemented, and may include, for example, silicon, silicon dioxide, aluminum oxide, germanium, gallium arsenide, indium phosphide, or some combination of one or more of the preceding materials. Rosette arrangements may include, for example, asymmetrical serpentine geometries similar to those used in strain-gauges. These conventional implementations of stress sensors typically require a precision current be supplied to the sensor, as well as a precision readout circuit to poll the stress measurement. Accordingly, implementations of multiple sensors, or arrays, are increasingly complex due to the necessary routing of precision current supplies and precision readout signals for each stress sensor circuit in the array. Some alternative implementations include on-chip current sources; however, such current sources are, in turn, sensitive to the mechanical stresses being measured and may contribute to errors in the measurement. Other implementations include shared current- and voltage-monitoring wiring; however, such implementations generally require multiple measurements, multiple meters, and/or physical switching between current and voltage meters, all of which obfuscate the benefits of the eliminated wires.

It is desirable to have simple stress sensors that are easily operated, e.g., powered and polled, or read, or sensed, and that provide high sensitivity. Further, it is desirable to have stress sensors that are easily arrayed to effect measurements on large structures.

BRIEF DESCRIPTION

According to one aspect of the present disclosure, a stress sensor circuit is provided. The stress sensor circuit includes a substrate and a bridge circuit disposed thereon. The bridge circuit is coupled between an output node and a ground node. The bridge circuit includes a first branch and a second branch, the first branch having a first resistor, R1, having a first orientation and coupled to a tuning resistor, Rtune, at a first intermediate node. The second branch includes a second resistor, R2, having a second orientation that is different from the first orientation, and coupled to a variable resistor, Rvar, at a second intermediate node. The bridge circuit includes an amplifier having a positive input terminal coupled to the second intermediate node, and a negative input terminal coupled to the first intermediate node. The amplifier generates a voltage output at the output node as a function of mechanical stress applied to the substrate. Rvar is non-linearly tunable based on the voltage output.

According to another aspect of the present disclosure, a stress sensor array is provided. The stress sensor array includes a voltage supply and a plurality of bridge circuits. The plurality of bridge circuits are disposed on respective substrates, wherein each substrate is configured to be subject to respective mechanical stress along at least one dimension. Each bridge circuit of the plurality of bridge circuits is coupled in parallel to the voltage supply, and each bridge circuit includes at least one resistor having a value that varies as a function of the respective mechanical stress to which its respective substrate is subjected, and an amplifier configured to generate a respective voltage output at an output node of the bridge circuit as a function of the mechanical stress applied to the substrate.

According to yet another aspect of the present disclosure, a method of measuring mechanical stress on a substrate is provided. The method includes supplying a voltage to a bridge circuit coupled between an output node and ground, the bridge circuit including at least one resistor having a value that varies as a function of the mechanical stress to which the substrate is subjected. The method includes comparing voltages at intermediate nodes of a first branch and a second branch of the bridge circuit to generate a voltage output at the output node as a function of the mechanical stress. The method includes tuning a switched capacitor resistor in the second branch using at least one of a variable frequency signal and a variable capacitance.

The features, functions, and advantages that have been discussed can be achieved independently in various embodiments or may be combined in yet other embodiments further details of which can be seen with reference to the following description and drawings.

DETAILED DESCRIPTION

Figure 1:
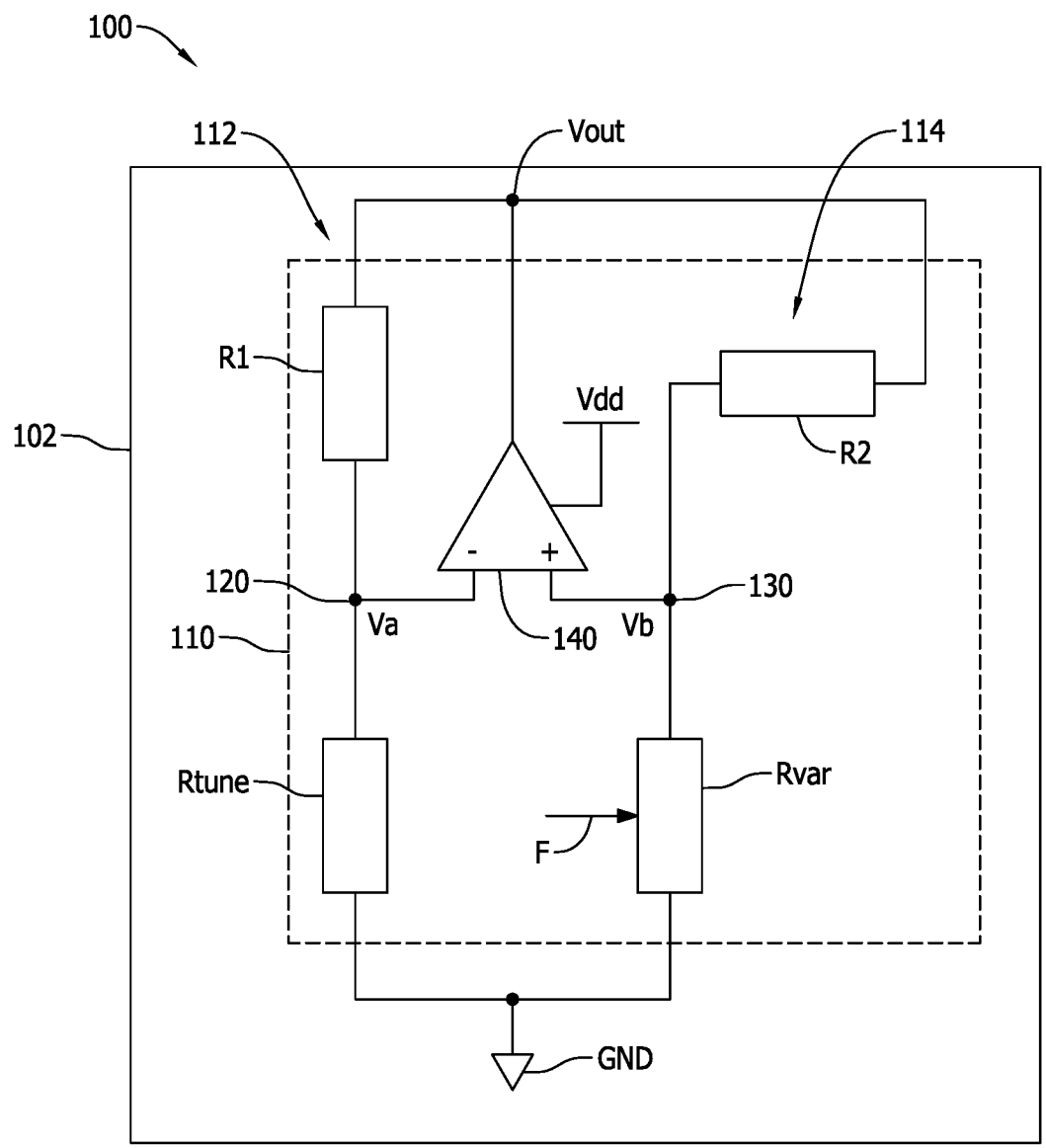
FIG. 1 is a schematic diagram of one embodiment of a stress sensor circuit.

As used herein, an element or step recited in the singular and preceded by the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

Embodiments of the stress sensors described herein provide a bridge circuit that is similar in structure to certain precision voltage reference (PVR) circuits, such as the PVR circuits described in U.S. Pat. No. 9,405,305, titled "Precision Voltage Reference Circuit with Tunable Resistance," assigned to The Boeing Company, of Chicago, Ill., which is hereby incorporated herein by reference in its entirety. Such PVR circuits are typically designed to provide a voltage output that is stable under varying age, temperature variation, and radiation events. Such precision is critical, because even small shifts in the voltage reference translate to errors in acceleration, position, and rotation. Some vehicles, for example, such as long-range guided vehicles, including intercontinental missiles and space vehicles, use inertial pendulum-based navigation systems, gyroscopic-based navigation systems, or some combination of both to satisfy their low tolerance for error in precision and accuracy.

Certain embodiments of the stress sensors described herein include a bridge circuit that is modified with respect to a PVR circuit. More specifically, in embodiments of the stress sensors described herein, aspects of the PVR circuit design are manipulated to provide a desired dynamic range of output, or sensitivity, as a function of, for example, mechanical stresses imparted on a semiconductor wafer substrate. For example, resistive components in a feedback path of a loop forming the bridge circuit are used as strain elements that reflect their mechanical stress variation over the range of output voltages synthesized by the bridge circuit. Conventionally, according to bandgap reference circuit design fundamentals, the resistive components in the feedback path, i.e., bias elements, are matched as closely as possible. Bridge circuits described herein instead utilize asymmetries in the resistive values of these resistive components due to mechanical stresses that either stretch or shorten, and either narrow or widen the resistive component. Under such mechanical stresses the resistive components operate as potentiometers and, due to interdependence of voltages and currents within the bridge circuit, reflect resistive variations (with opposite signs) in opposite branches of the bridge circuit, thereby compounding the sensitivity of the bridge circuit to mechanical stresses.

Similarly, an otherwise tunable semiconductor resistor in the reference branch of the bridge circuit may be held fixed, or constant, and only varies according to lattice modifications in the semiconductor itself due to mechanical stresses, and the lattice modifications manifest in the output voltage of the bridge circuit. Conversely, stability of the bridge circuit with respect to power supply and temperature is substantially maintained.

An exemplary bridge circuit includes an amplifier that self-references through a negative feedback loop, which eliminates direct dependencies of the voltage output from the supply of the circuit. Some exemplary bridge circuits include a variable resistor in a variable branch that is configured to be tuned based on an output voltage to provide a desired non-linearity in the voltage divider formed by the variable branch. Some exemplary bridge circuits include a switched capacitor resistor that is configured to be tuned by a control signal governing at least one of a variable frequency signal and a variable capacitance. Generally, any such switches and capacitors will impart inherent non-linearities into the voltage divider.

In certain embodiments, the variable frequency signal is paired with a constant capacitance. Such embodiments fall into a first class of embodiments. Embodiments of the stress sensors described herein that utilize a variable frequency signal generate a variable frequency signal using a voltage controlled oscillator (VCO) that is configured to be tuned to a variable frequency based on the voltage output. Certain VCOs, such as a relaxation VCO and a differential L-C tank VCO, can be implemented to be particularly temperature-stable and radiation-stable. In alternative embodiments, the variable frequency signal is tuned to a constant frequency to maintain a constant resistance value, although inherent non-linearities in the voltage divider persist at least in the implementation of the constant capacitance.

In other embodiments, a variable capacitance is paired with a constant frequency signal generated by a precision clock device, such as a crystal oscillator, which is also temperature and radiation stable. These embodiments fall into a second class of embodiments. Embodiments of the stress sensors described herein that utilize a variable capacitor (hereinafter, "varactor"), tune the capacitance to a variable capacitance value C based on the voltage reference. Certain varactors, such as a MOS varactor, a MOSFET capacitor, and a MEMS varactor, can also be implemented to be temperature- and radiation-stable. In alternative embodiments, the variable capacitance is tuned to a constant capacitance value to maintain a constant resistance value, although inherent non-linearities in the voltage divider persist at least in the implementation of the varactor.

Stress sensors described herein may be embodied on semiconductor wafers that are integrated into larger mechanical structures, where the mechanical strains of the larger mechanical structures are tightly coupled to the mechanical strains of the semiconductor wafers themselves. Such embodiments enable micro-scale monitoring of local stresses on the larger mechanical structures. Embodiments of the stress sensors described herein provide greater sensitivity, simpler implementation, and easier operation, e.g., simpler powering and simpler readout.

FIG. 1 is a schematic diagram of one embodiment of a stress sensor circuit 100 disposed on a substrate 102. Stress sensor circuit 100 includes a bridge circuit 110 coupled between an output node, Vout, and a ground node, GND. The output node and an output voltage present on the output node are interchangeably referred to herein as Vout. Bridge circuit 110 includes a first branch 112, sometimes referred to as a tuning branch, having a resistor of value R1 and another resistor of value Rtune. R1 is also referred to as $R_{top-tune}$. Within first branch 112, between R1 and Rtune, is a first intermediate node 120. Bridge circuit 110 also includes a second branch 114, sometimes referred to as a variable branch, having a resistor of value R2 and a variable resistor of value Rvar. R2 is also referred to as $R_{top-var}$, and is oriented about 90 degrees with respect to the orientation of R1, such that respective orientations of R1 and R2 are substantially orthogonal. A resistor, when disposed on substrate 102 or implemented within an electronic circuit or other device, has an orientation defined by its longitudinal axis, or length dimension. Substantially orthogonal, for the purpose of the stress sensor circuits described herein, is defined as having relative orientations separated by 90 degrees, with a tolerance of plus, or minus, 10 degrees. In alternative embodiments, R1 and R2 may have respective orientations that are separated by at least 10 degrees such that R1 and R2 exhibit varying shifts in resistive values due to mechanical stresses imparted on substrate 102 on which R1 and R2 are disposed. In other words, for the purpose of the stress sensor circuits described herein, R1 and R2 should have different orientations. Within second branch 114, between R1 and Rvar, is a second intermediate node 130. In certain embodiments, resistors R1 and R2 in the first and second branches 112 and 114, respectively, and Rtune are precision resistors, making them temperature- and radiation-stable.

Bridge circuit 110 also includes an amplifier 140 coupled as a bridge between first intermediate node 120 and second intermediate node 130. Amplifier 140 is supplied a voltage, Vdd. Amplifier 140 includes a negative input terminal coupled to first intermediate node 120 and a positive input terminal coupled to second intermediate node 130. Amplifier 140 also includes an output terminal coupled to Vout. In certain embodiments, amplifier 140 includes a plurality of metal-oxide semiconductor field effect transistors (MOSFETs), making amplifier 140 temperature-stable and radiation-stable.

During operation, Vout is divided by first branch 112 and second branch 114 based on values of R1 and Rtune, and R2 and Rvar, respectively. A voltage Va presents at first intermediate node 120 and a voltage Vb presents at second intermediate node 130. The divider formed by first branch 112 is relatively linear, i.e., Va is linear with respect to Vout. In certain embodiments, such as in PVR circuits, the divider formed by second branch 114 is preferably substantially non-linear, i.e., Vb is substantially non-linear with respect to Vout. Such an arrangement makes the PVR circuit output less sensitive with respect to variations in resistive values of R1, R2, Rtune, and Rvar. In other embodiments of bridge circuits described herein, the divider formed by second branch 114 is preferably more linear to yield greater dynamic range, or sensitivity, of Vout as relative resistive values of R1, R2, Rtune, and Rvar shift relative to each other due to, for example, mechanical stresses. More specifically, R1 and R2 are orthogonally oriented with respect to each other. Such orientation enables increased variation in resistive values due to mechanical stresses acting on two dimensions of the wafer or substrate 102 on which bridge circuit 110 is implemented, which is analogous to a strain gauge. Each of R1 and R2 exhibits variation in resistive value due to compression and tension along both the longitudinal and lateral axis; however, such variations are more pronounced along the longitudinal axis of a resistor.

Amplifier 140 operates as a linear high-gain error amplifier and generates Vout, which is fed back to the branches, serving as a self-reference for bridge circuit 110. Self-referencing of bridge circuit 110 using amplifier 140 substantially eliminates supply dependence and provides a closed-loop convergence once a startup voltage is applied via a startup circuit (not shown). The startup circuit activates the loop, for example, by raising the voltage Vb at second intermediate node 130 upon power-on. Amplifier 140 is supplied by a largely non-regulated voltage supply and can be implemented with a power supply rejection (PSR) of at least 100 dB. Furthermore, amplifier 140 operates in the forward path of the closed-loop, which reduces and/or minimizes the impact of its own shifts, e.g., versus temperature and radiation over the stability of the bridge. Self-starting implementations can be designed such that the amplifier itself functions as a startup circuit, due at least in part to the pull-up action of its output upon initial application of a supply voltage.

In certain embodiments, frequency F is variable and tunable, and capacitance C is constant, which is referred to as the first class of embodiments. In other embodiments, frequency F is stable and capacitance C is tunable, which is referred to as the second class of embodiments. In a third class of embodiments, frequency F and capacitance C are tuned to respective constant values to improve the sensitivity of the stress sensors described herein.

Sensitivity of stress sensor circuit 100 is tuned based on the values of R1, R2, Rtune, and Rvar. More specifically, bridge circuit 110 converges on a voltage output, Vout, based on the value of Rvar relative to Rtune, and based on the value of R1 relative to R2. In certain embodiments, the variable resistor of value Rvar is implemented as a switched capacitor resistor with a constant capacitance C that is alternately charged and discharged through switches controlled by a sinusoidal or square-wave signal having a frequency F. Generally, as the frequency of the control signal increases, Rvar decreases, because the capacitance in the switched capacitor resistor is constant. Such embodiments fall into the first class of embodiments.

In other embodiments, the variable resistor of value Rvar is implemented as a varactor controlled by a signal having stable frequency. Generally, as the capacitance value C of the varactor increases with Vout, Rvar decreases, because the frequency F operating Rvar is constant. Such embodiments fall into a second class of embodiments.

In alternative embodiments of the stress sensors described herein, the value of Rvar is held quasi-constant by tuning frequency F to a constant value, capacitance C to a constant value, and relying on small residual non-linearities of parasitic elements such as the junction capacitors of the switches forming the switched-capacitor arrangement to provide an equilibrium, Voi, of the intermediate nodes of the bridge, and subsequently of the circuit as a whole, including its output (Vo). Such embodiments fall into the third class of embodiments.

Figure 2A:
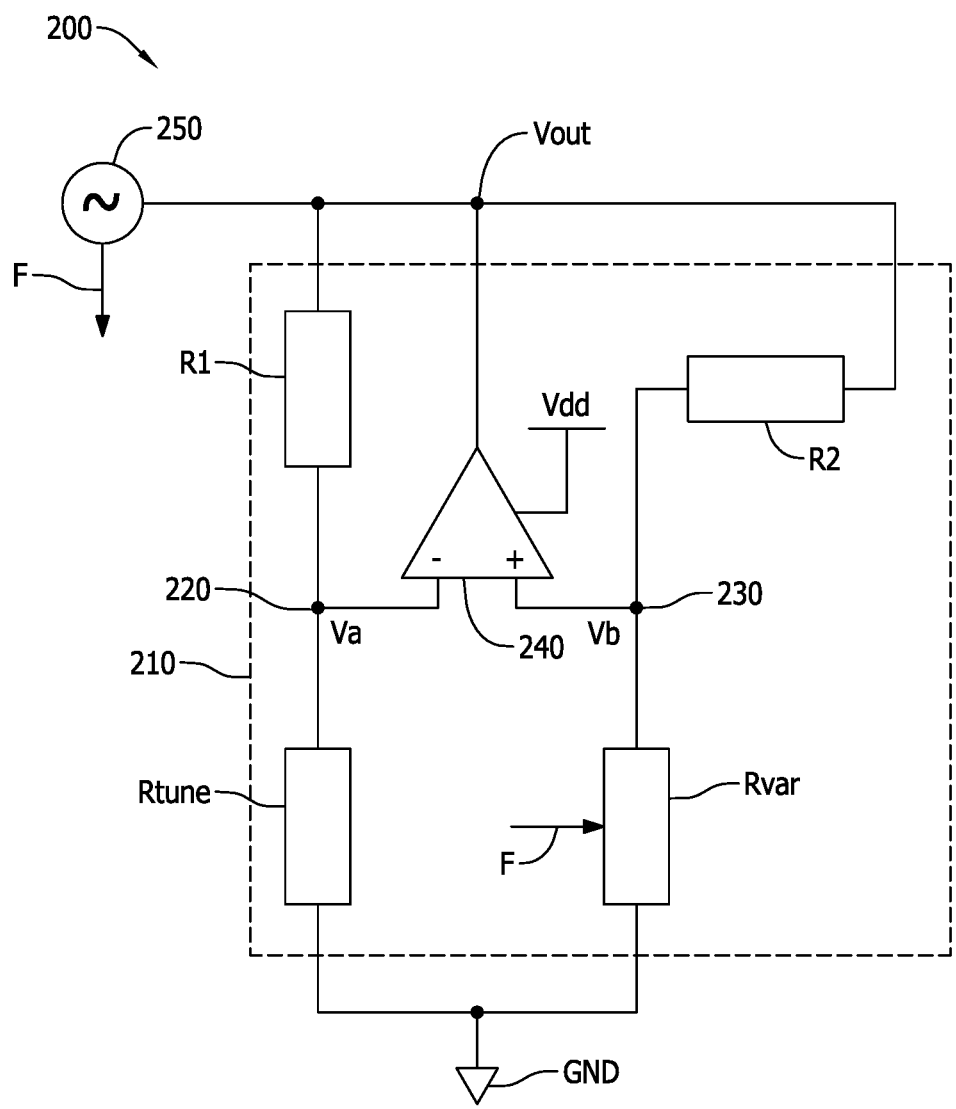
FIG. 2A is a schematic diagram of another embodiment of a stress sensor circuit.

FIG. 2A is a schematic diagram of another embodiment of a stress sensor circuit 200. Stress sensor circuit 200 falls into the first class of embodiments. Stress sensor circuit 200 includes a bridge circuit 210 coupled between Vout and a ground, GND, similar to bridge circuit 110 (shown in FIG. 1). Bridge circuit 210 includes resistors R1 and R2, resistor Rtune, and switched capacitor resistor Rvar (all shown in FIG. 1). Bridge circuit 210 also includes a first intermediate node 220, a second intermediate node 230, and an amplifier 240 coupled between. Amplifier 240 is supplied voltage Vdd. Bridge circuit 210 operates the same as bridge circuit 110.

Stress sensor circuit 200 further includes a voltage controlled oscillator (VCO) 250. Switched capacitor resistor Rvar includes a capacitance C, and is controlled by a periodic signal of frequency F. The periodic signal is generated by VCO 250 at frequency F. Frequency F is tuned to a variable frequency based on Vout, and capacitance C is constant. In such embodiments, VCO 250 can be, for example, a ring VCO, a relaxation VCO or a differential LC-tank VCO.

Figure 2B:
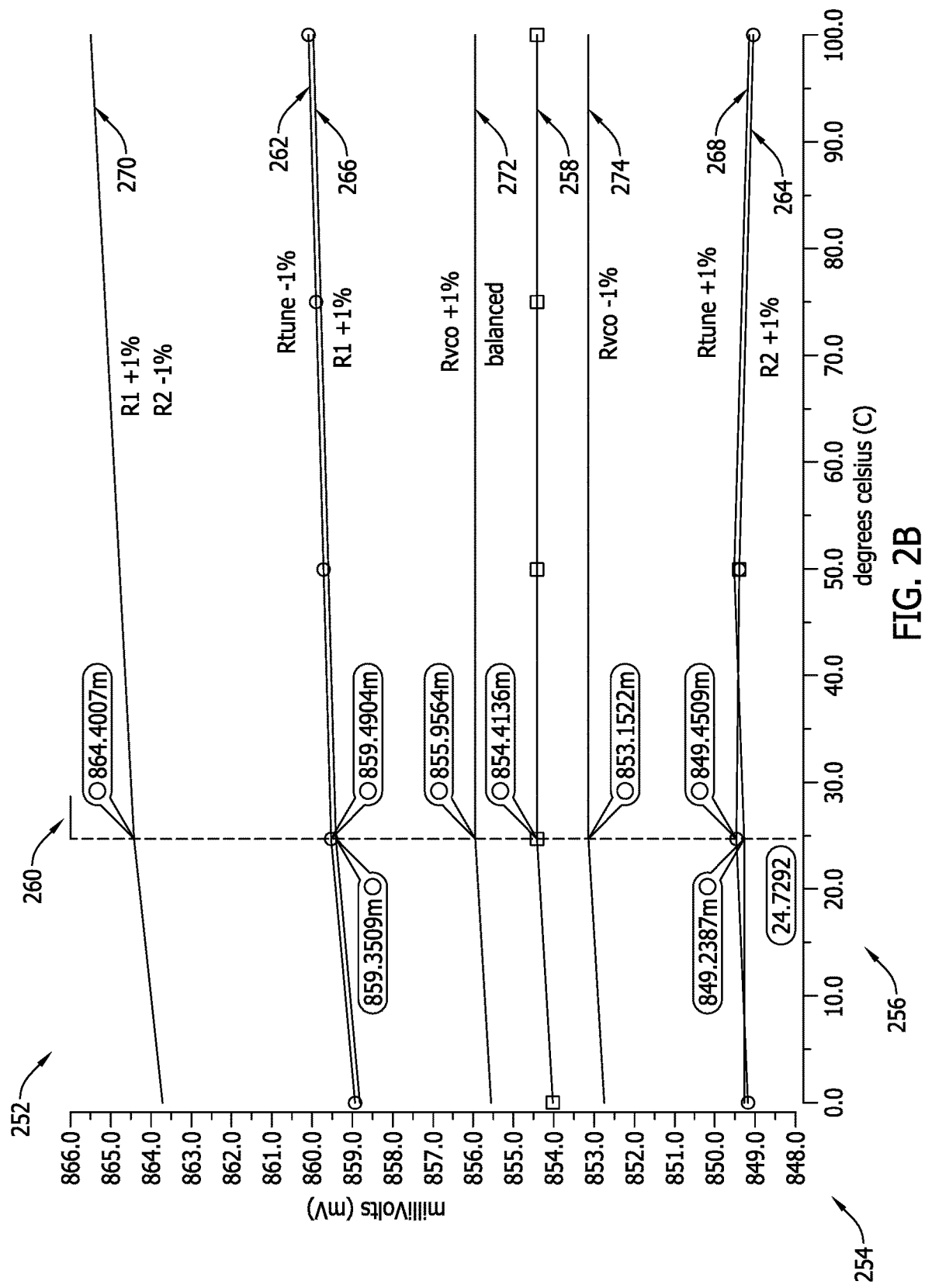
FIG. 2B is a graph of exemplary sensitivity to resistive value shifts within the stress sensor circuit shown in FIG. 2A.

Stress sensor circuit 200 exhibits sensitivity to mechanical stress applied to the semiconductor wafer, or substrate 102, due to the respective sensitivities of R1 and R2, Rtune, and Rvar. FIG. 2B is a graph 252 of exemplary sensitivity to resistive value shifts within stress sensor circuit 200 shown in FIG. 2A. Graph 252 represents a voltage output of stress sensor circuit 200 given a shift in resistive value of one or more components of stress sensor circuit 200 over a range of semiconductor junction temperatures. A vertical axis 254 of graph 252 represents voltage expressed in millivolts (mV), and ranging from 848 mV to 866 mV. A horizontal axis 256 represents semiconductor junction temperature expressed in degrees Celsius (C), and ranging from 0.0 degrees (C.) to 100 degrees (C.).

Graph 252 includes a baseline voltage reference 258 representing stress sensor circuit 200 under a balanced condition. In other words, baseline voltage reference 258 represents the voltage output, Vout, of stress sensor circuit 200 when the resistive values of the components are not shifted due to mechanical stress. In the embodiment illustrated in graph 252, baseline voltage reference 258 is about 854 mV at about 25 degrees C., which is indicated by a vertical indicator line 260.

Graph 252 includes plots 262 and 264 representing the voltage output, Vout, of stress sensor circuit 200 when the resistive value of Rtune shifts plus, or minus, 1%. Plot 262 illustrates Vout is about 859 mV when Rtune shifts −1% at about 25 degrees C. Likewise, plot 264 illustrates Vout is about 849 mV when Rtune shifts +1% at about 25 degrees C. Similarly, graph 252 includes plots 266 and 268 representing the voltage output, Vout, of stress sensor circuit 200 when the resistive values of R1 or R2 shift +1%. Plot 266 illustrates Vout is about 859 mV when R1 shifts +1% at about 25 degrees C., and plot 268 illustrates Vout is about 849 mV when R2 shifts +1% at about 25 degrees C. These shifts indicate a sensitivity of about 5 mV, or 0.6% output shift, per 1% elemental resistor shift: or about 60% of the sensitivity of a comparable rosette circuit.

Graph 252 includes a plot 270 representing the voltage output, Vout, of stress sensor circuit 200 when the resistive values of R1 and R2 shift reciprocally by 1%, e.g., when R1 shifts +1% and R2 shifts −1% in response to the same mechanical stress stimulus. Plot 270 illustrates Vout is about 864 mV when R1 and R2 shift reciprocally by 1% at about 25 degrees C. This shift indicates a sensitivity of about 10 mV, or 1.2% output shift, per 1% elemental resistor shift.

Although Rvar, a switched capacitor resistor, is controlled by a periodic signal generated by VCO 250 and varies with frequency F of the periodic signal, the resistive value of Rvar also shifts with tension and compression forces resulting from the mechanical stress. Moreover, VCO 250 itself is sensitive to mechanical stress. Graph 252 includes plots 272 and 274 representing the voltage output, Vout, of stress sensor circuit 200 when an internal resistive value within VCO 250, Rvco, shifts plus, or minus, 1%. Plot 272 illustrates Vout is about 856 mV when Rvco shifts +1% at about 25 degrees C. Likewise, plot 274 illustrates Vout is about 853 mV when Rvco shifts −1% at about 25 degrees C., highlighting a lesser sensitivity of the bridge to shifts in those respective elemental resistors, which could, however, be advantageously compounded to shifts in the main elemental resistors, e.g., R1 and R2.

In certain embodiments, where the periodic signal generated by VCO 250 is modulated by the shifting equilibrium of bridge circuit 210, the frequency F of the periodic signal shifts in response to mechanical stresses as well. The frequency F can be read with a traditional pulse counter generally with greater precision than a voltage. Further, in certain embodiments, the frequency F of VCO 250 is coupled to or otherwise integrated with an antenna, and the periodic signal may be broadcast by the antenna, i.e., the antenna radiates according to the frequency F of the periodic signal, such that remote readers, or antennas, within an appropriate range may sense the frequency F of the periodic signal generated by VCO 250 and subsequently poll the corresponding stress level affecting bridge circuit 210.

Figure 3A:
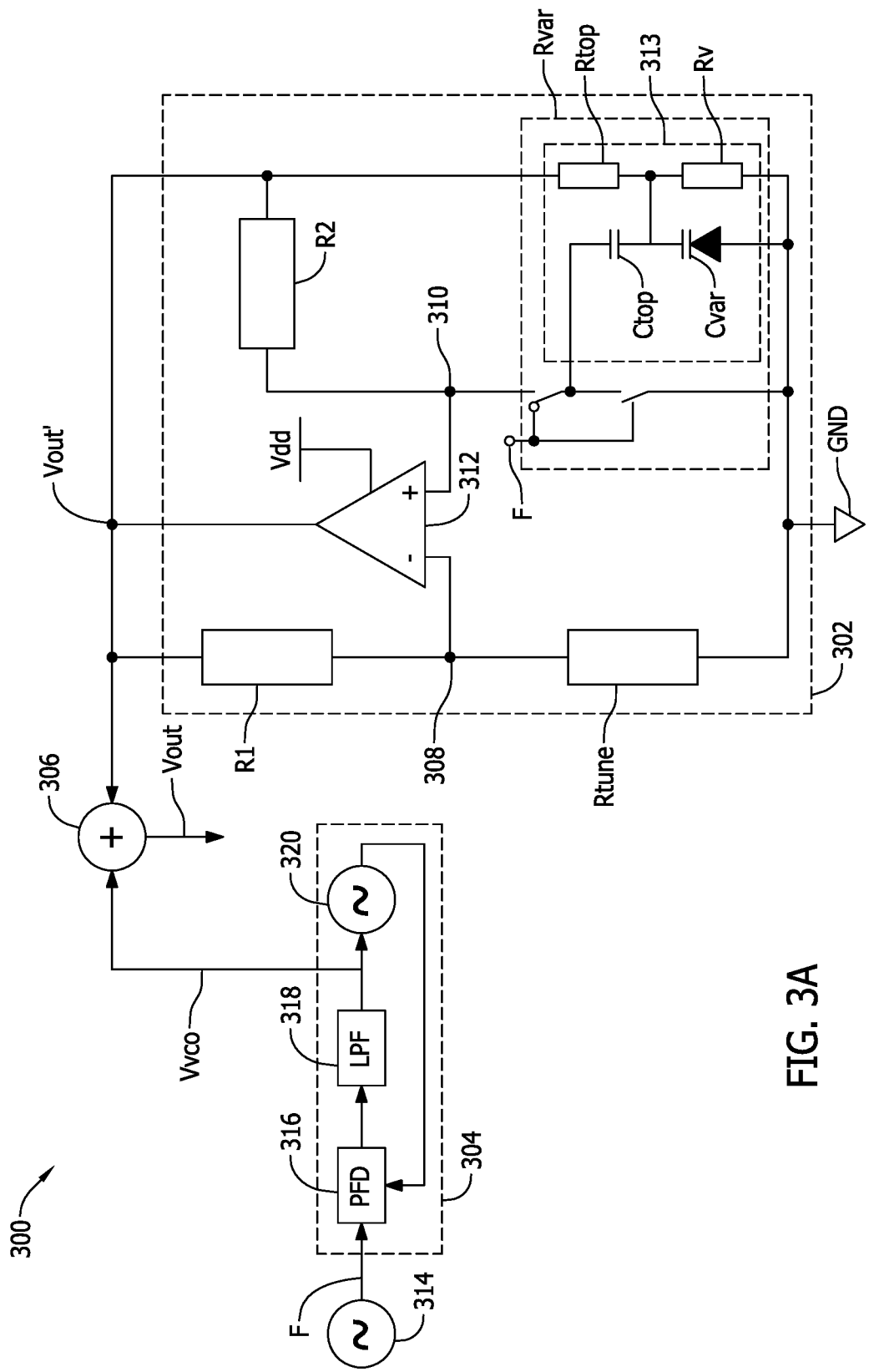
FIG. 3A is a schematic diagram of yet another embodiment of a stress sensor circuit.

FIG. 3A is a schematic diagram of yet another embodiment of a stress sensor circuit 300. Stress sensor circuit 300 falls into the second class of embodiments. Stress sensor circuit 300 includes a bridge circuit 302 coupled between Vout' and a ground, GND (similar to bridge circuit 110, shown in FIG. 1), a phase-lock loop (PLL) circuit 304, and a summer 306. Bridge circuit 302 includes resistors R1 and R2, resistor Rtune, and switched capacitor resistor Rvar (all shown in FIG. 1). Bridge circuit 302 also includes a first intermediate node 308, a second intermediate node 310, and an amplifier 312 coupled between. Amplifier 312 is supplied a voltage Vdd. Bridge circuit 302 operates the same as bridge circuit 110.

In the switched capacitor resistor, Rvar is implemented as a varactor 313 having a variable capacitance C and tunable to a variable capacitance value based on the value of Vout'. The switched capacitor resistor is controlled by a periodic signal having a constant frequency F. The periodic signal is generated by a precision clock 314. Precision clock 314, in certain embodiments, includes a crystal oscillator for generating the periodic signal of constant frequency F. In certain embodiments, PLL circuit 304 and summer 306 are omitted and precision clock 314 directly drives the switched capacitor resistor Rvar.

Varactor 313 includes a constant capacitance Ctop and a varactor diode Cvar. The capacitance of varactor diode Cvar is tuned by a voltage divider, including a resistor Rtop and a resistor Rv, coupled between the output voltage, Vout', of bridge circuit 302 and GND.

PLL circuit 304 further includes a phase and frequency detector (PFD) 316, a low-pass filter 318, and a VCO 320. VCO 320 is tuned by a varactor of the same type as in the switched capacitor of the resistor of value Rvar. VCO 320 is configured to generate a sinusoidal signal that is fed back to PFD 316 where it is compared to the periodic signal of frequency F generated by precision clock 314. PLL circuit 304 tunes VCO 320 to emit a periodic signal of frequency F. PLL circuit 304 thereby generates an internal tuning voltage Vvco that compensates for any exogenous variations of the varactors in VCO 320 and the switched capacitor resistor, Rvar, including temperature, radiation, and process corner skew, among others. Tuning voltage Vvco is applied by PLL circuit 304 to VCO 320 to substantially counter the same variations that impact the varactor in Rvar. Therefore, when Vvco is added to Vout' at summer 306, the resulting voltage, Vout, is compensated for such exogenous effects.

Figure 3B:
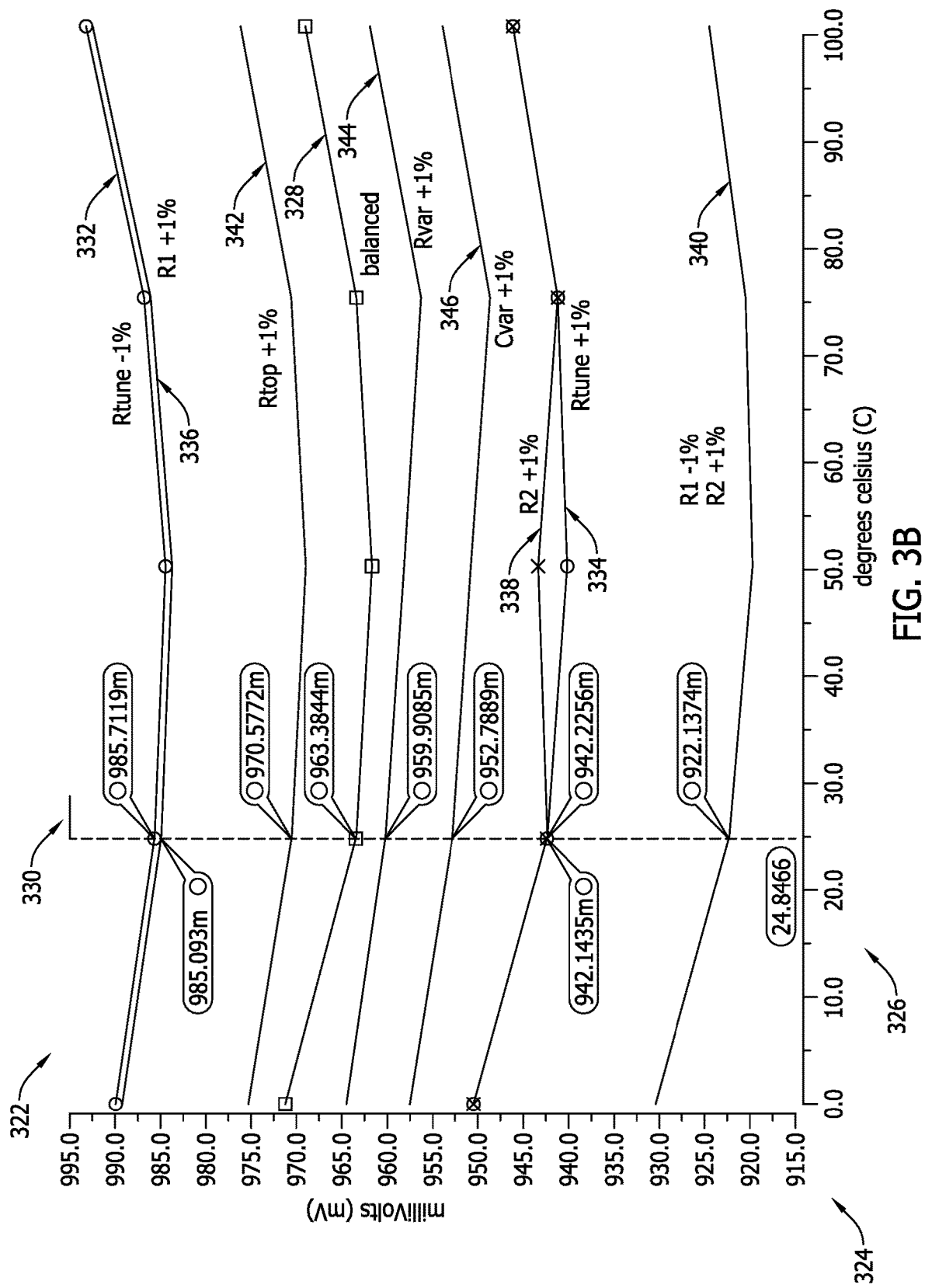
FIG. 3B is a graph of exemplary sensitivity to resistive value shifts within the stress sensor circuit shown in FIG. 3A.

Stress sensor circuit 300 exhibits sensitivity to mechanical stress applied to the semiconductor wafer, or substrate 102, due to the respective sensitivities of R1 and R2, Rtune, and Rvar. FIG. 3B is a graph 322 of exemplary sensitivity to resistive value shifts within stress sensor circuit 300 shown in FIG. 3A. Graph 322 represents a voltage reference, i.e., a voltage output, of stress sensor circuit 300 given a shift in resistive value of one or more components of stress sensor circuit 300 over a range of semiconductor junction temperatures. A vertical axis 324 of graph 322 represents voltage expressed in millivolts (mV), and ranging from 915 mV to 995 mV. A horizontal axis 326 represents semiconductor junction temperature expressed in degrees Celsius (C), and ranging from 0.0 degrees (C.) to 100 degrees (C.).

Graph 322 includes a baseline voltage reference 328 representing stress sensor circuit 300 under a balanced condition. In other words, baseline voltage reference 328 represents the voltage output, Vout, of stress sensor circuit 300 when the resistive values of the components are not shifted due to mechanical stress. In the embodiment illustrated in graph 322, baseline voltage reference 328 is about 963 mV at about 25 degrees C., which is indicated by a vertical indicator line 330. Graph 322 illustrates the degree of sensitivity of stress sensor circuit 300 to temperature variations, and how the sensitivity of sensor circuit 300 to mechanical stress is relatively stable over the range of semiconductor junction temperatures.

Graph 322 includes plots 332 and 334 representing the voltage output, Vout, of stress sensor circuit 300 when the resistive value of Rtune shifts plus, or minus, 1%. Plot 332 illustrates Vout is about 986 mV when Rtune shifts −1% at about 25 degrees C. Likewise, plot 334 illustrates Vout is about 942 mV when Rtune shifts +1% at about 25 degrees C. Similarly, graph 322 includes plots 336 and 338 representing the voltage output, Vout, of stress sensor circuit 300 when the resistive values of R1 or R2 shift +1%. Plot 336 illustrates Vout is about 985 mV when R1 shifts +1% at about 25 degrees C., and plot 338 illustrates Vout is about 942 mV when R2 shifts +1% at about 25 degrees C. These shifts indicate a sensitivity of about 21 mV, or 2.1% output shift, per 1% elemental resistor shift, or about 210% sensitivity of a comparable rosette circuit; and approaching the sensitivity of a comparable van der Pauw circuit, as described in A. Mian, J. C. Suhling, and R. C. Jaeger, *The van der Pauw Stress Sensor*, IEEE Sensors Journal, vol. 6, no. 2, April 2006.

Graph 322 includes a plot 340 representing the voltage output, Vout, of stress sensor circuit 300 when the resistive values of R1 and R2 shift reciprocally by 1%, e.g., when R1 shifts −1% and R2 shifts +1%. Plot 340 illustrates Vout is about 922 mV when R1 and R2 shift reciprocally by 1% at about 25 degrees C. This shift indicates a sensitivity of about 41 mV, or 4.1% output shift, per 1% elemental resistor shift.

Graph 322 includes plots 342, 344, and 346 representing the voltage output, Vout, of stress sensor circuit 300 when the resistive values of components within varactor 313 shift by +1%. For example, plot 342 illustrates Vout is about 970 mV when Rtop shifts by +1% at about 25 degrees C., and plot 344 illustrates Vout is about 960 mV when Rv shifts by +1% at about 25 degrees C. This shift indicates a sensitivity of about 3 mV to 7 mV per 1% elemental resistor shift. Plot 346 illustrates Vout is about 953 mV when the varactor's capacitance, Cvar, itself shifts by +1% at about 25 degrees C. This shift indicates a sensitivity of about 10 mV, or 1% output shift, per 1% elemental resistor shift.

Figure 4A:
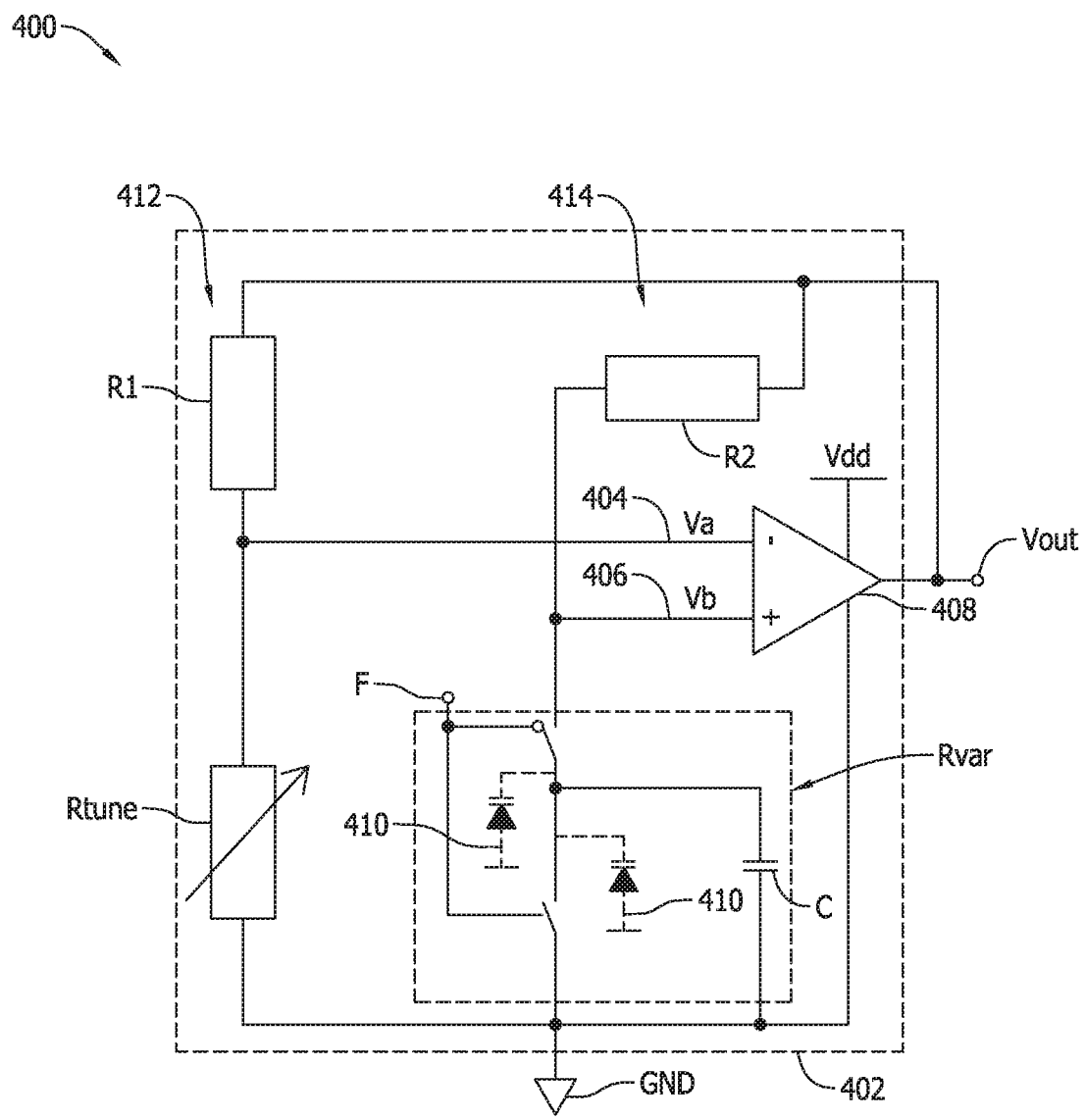
FIG. 4A is a schematic diagram of yet another embodiment of a stress sensor circuit.

FIG. 4A is a schematic diagram of yet another embodiment of a stress sensor circuit 400. Stress sensor circuit 400 falls into the third class of embodiments. Stress sensor circuit 400 includes bridge circuit 402 coupled between Vout and a ground, GND, similar to bridge circuit 110 (shown in FIG. 1). Bridge circuit 402 includes resistors R1 and R2, resistor Rtune, and switched capacitor resistor Rvar (all shown in FIG. 1). Bridge circuit 402 also includes a first intermediate node 404, a second intermediate node 406, and an amplifier 408 coupled between. Amplifier 408 is supplied a voltage Vdd. Bridge circuit 402 includes a tuning branch 412, including resistors R1 and Rtune, and a variable branch 414, including resistor R2 and Rvar. Bridge circuit 402 operates the same as bridge circuit 110.

Rvar is implemented as a switched capacitor resistor having a constant capacitance C. The switched capacitor resistor is controlled by a periodic signal having a constant frequency F. The periodic signal is generated by a precision clock (not shown), such as, for example, a crystal oscillator for generating the constant frequency F periodic signal.

In alternative embodiments, the capacitance C within the switch capacitor resistor is implemented as a varactor. Generally, as the capacitance value C of the varactor increases with Vout, Rvar decreases, because the frequency F operating Rvar is constant. In embodiments of the stress sensors described herein, the value of Rvar is held quasi-constant by tuning capacitance C to a constant value, and relying on small residual non-linearities of parasitic elements 410, such as the junction capacitors of the switches forming the switched-capacitor arrangement to provide an equilibrium, Voi, of the intermediate nodes of the bridge, and subsequently of the circuit as a whole, including its output (Vo). The constant capacitance C in combination with such inherent parasitic capacitances 410 yield a voltage Vb resulting from the divider formed by variable branch 414, which is relatively linear (Rvar is quasi-constant) with respect to Vout. Vb always exhibits at least some non-linearity due to parasitic capacitances 410.

Figure 4B:
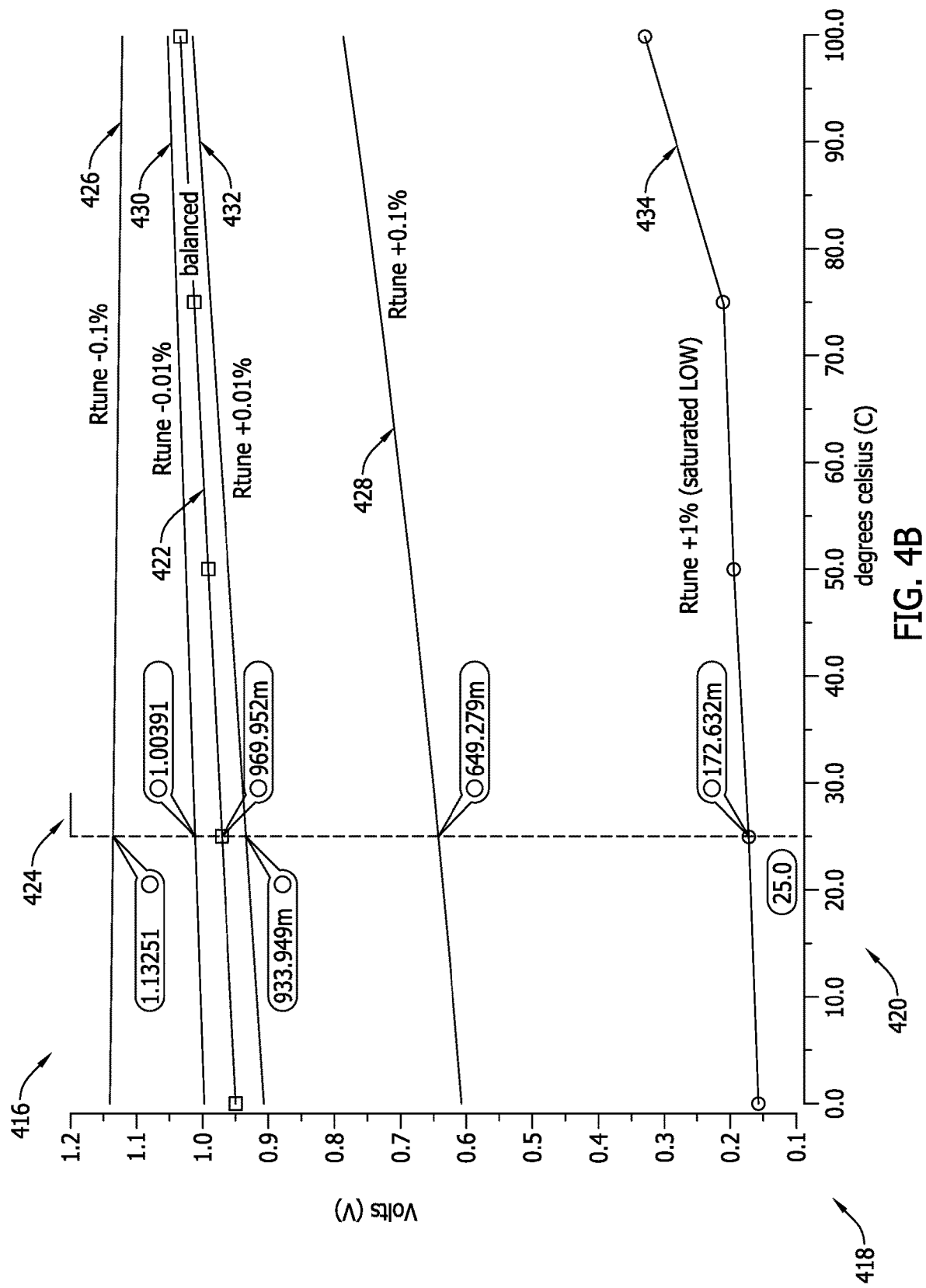
FIG. 4B is a graph of exemplary sensitivity to resistive value shifts within the stress sensor circuit shown in FIG. 4A.

Stress sensor circuit 400 exhibits sensitivity to mechanical stress applied to the semiconductor wafer, or substrate 102, due to the respective sensitivities of R1 and R2, Rtune, and Rvar. FIG. 4B is a graph 416 of exemplary sensitivity to resistive value shifts within stress sensor circuit 400 shown in FIG. 4A. Graph 416 represents a voltage output of stress sensor circuit 400 given a shift in resistive value of one or more components of stress sensor circuit 400 over a range of semiconductor junction temperatures. A vertical axis 418 of graph 416 represents voltage expressed in volts (V), and ranging from 0.100 mV to 1.200 mV. A horizontal axis 420 represents semiconductor junction temperature expressed in degrees Celsius (C), and ranging from 0.0 degrees (C.) to 100 degrees (C.).

Graph 416 includes a baseline voltage output 422 representing stress sensor circuit 400 under a balanced condition. In other words, baseline voltage output 422 represents the voltage output, Vout, of stress sensor circuit 400 when the resistive values of the components are not shifted due to mechanical stress. In the embodiment illustrated in graph 416, baseline voltage output 422 is about 0.970 V at about 25 degrees C., which is indicated by a vertical indicator line 424. Graph 416 illustrates the degree of sensitivity of stress sensor circuit 400 to temperature variations, and how the sensitivity of stress sensor circuit 400 to mechanical stress is relatively stable over the range of semiconductor junction temperatures.

Graph 416 includes plots 426 and 428 representing the voltage output, Vout, of stress sensor circuit 400 when the resistive value of Rtune shifts minus, or plus, 0.1%. Plot 426 illustrates Vout is about 1.133 V when Rtune shifts −0.1% at about 25 degrees C., yielding a sensitivity of about 163 mV per +0.1% shift. Likewise, plot 428 illustrates Vout is about 0.649 V when Rtune shifts +0.1% at about 25 degrees C., yielding a sensitivity of about 321 mV per −0.1% shift. Further, graph 416 includes plots 430 and 432 representing the voltage output, Vout, of stress sensor circuit 400 when the resistive values of Rtune shifts by as little as minus, or plus, 0.01%. Plot 430 illustrates Vout is about 1.004 V when Rtune shifts −0.01% at about 25 degrees C. Likewise, plot 432 illustrates Vout is about 0.934 V when Rtune shifts +0.01% at about 25 degrees C. These shifts indicate a sensitivity of at least 34 mV per 0.01% elemental resistor shift, or about 340 times the sensitivity of a comparable rosette circuit, and about 108 times the sensitivity of a comparable van der Pauw circuit.

Graph 416 includes a plot 434 representing the voltage output, Vout, of stress sensor circuit 400 when the resistive value of Rtune shifts by as much as +1%. Plot 434 illustrates Vout is about 0.173 V when Rtune shifts by +1% at about 25 degrees C., highlighting a virtual saturation of the circuit in the presence of an elemental resistor shift that before was only detected with a much more moderate gain.

Figure 5:
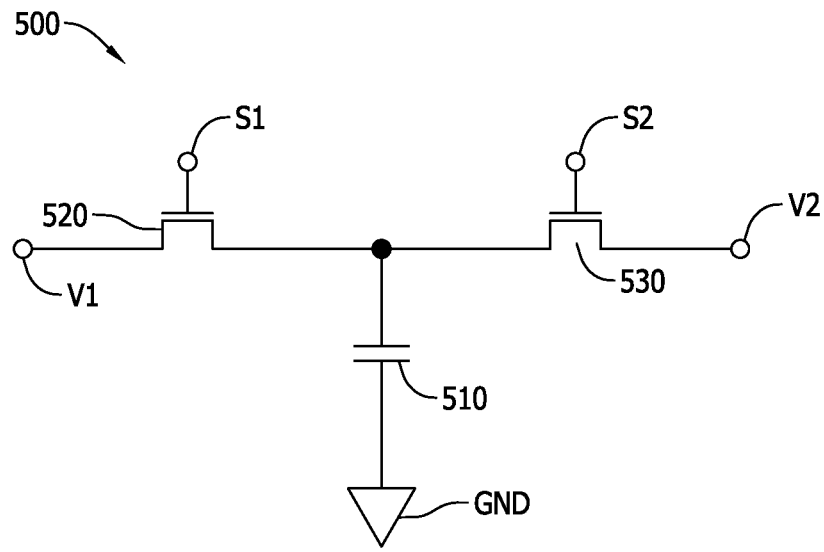
FIG. 5 is a schematic diagram of one embodiment of a switched capacitor resistor.

FIG. 5 is a schematic diagram of one embodiment of a switched capacitor resistor 500 for use in a stress sensor circuit, such as stress sensor circuits 100, 200, 300, and 400 (shown in FIGS. 1-4). Switched capacitor resistor 500 includes a capacitor 510, a first MOSFET 520, and a second MOSFET 530. First MOSFET 520 and second MOSFET 530 are coupled in series, source to drain, between a first terminal V1 and a second terminal V2. First MOSFET 520 and second MOSFET 530 can be NMOS or PMOS devices. In alternative embodiments, first MOSFET 520 and second MOSFET 530 can be replaced by any other suitable switching device, including, for example, relays. Electromechanical relays have an advantage, for example, that they are both more temperature- and radiation-stable than their semiconductor counterparts.

Capacitor 510 is coupled between ground and a node between first MOSFET 520 and second MOSFET 530. First MOSFET 520 and second MOSFET 530 are respectively controlled by a first switch signal S1 and a second switch signal S2, at the respective gates of first MOSFET 520 and second MOSFET 530. First MOSFET 520 and second MOSFET 530 are opened and closed alternatingly. In certain embodiments, first switch signal S1 and second switch signal S2 are implemented as a single periodic signal having a frequency F. For example, in an embodiment having complementary NMOS and PMOS switches, a single periodic signal can control both first MOSFET 520 and second MOSFET 530.

When a voltage, V, is presented at V1, capacitor 510 is charged when first MOSFET 520 is closed and second MOSFET 530 is open. When first MOSFET 520 opens and second MOSFET 530 closes, capacitor 510 discharges, moving the charge to V2, which may be connected to ground, for example. The movement of the charge from V1 to V2 is a current. The amount of current is quantified by the change in charge over a change in time, or I=dq/dt, that can be expressed, for a capacitance C and a control signal having a frequency f, as I=C·V·f. Kirchhoff's law, R=V/1, permits the resistance of switched capacitor resistor 500 to be expressed as R=1/(C·f). The tunability of capacitance C or frequency f permits classification of stress sensor circuits into the first class or the second class described above with respect to FIGS. 2-4.

In certain embodiments, capacitor 510 is a constant capacitance parallel plate capacitor and first MOSFET 520 and second MOSFET 530 are controlled by a variable frequency signal as first switch signal S1 and second switch signal S2. As the variable frequency signal increases in frequency, the resistance of switched capacitor resistor 500 decreases. In certain embodiments, capacitor 510 is a variable capacitance, such as a varactor, and first MOSFET 520 and second MOSFET 530 are controlled by a constant frequency signal. As the variable capacitance increases, the resistance of switched capacitor resistor 500 decreases. In certain embodiments, capacitor 510 is a variable capacitance, such as a varactor, and first MOSFET 520 and second MOSFET 530 are controlled by a variable frequency signal. Varying both the capacitance of capacitor 510 and the frequency of first switch signal S1 and second switch signal S2 facilitates finer tuning and compensation of the resistance of switched capacitor resistor 500.

In certain embodiments, capacitor 510 is implemented as a varactor on silicon, such as a silicon junction or MOS capacitor. In other embodiments, capacitor 510 is implemented with discrete components, such as one or more relays controlling a varactor. In certain embodiments, capacitor 510 is a varactor implemented using micro-electromechanical systems (MEMS) devices to form an electrically controlled parallel plate capacitor. In a MEMS varactor, two terminals are used for controlling the separation of the parallel plates by pushing or pulling the plates together or apart. Two other terminals are used as the terminals of the capacitor. A MEMS varactor provides good temperature and radiation stability, because the dielectric and plates are both mechanically and chemically stable. The MEMS varactor also requires an externally-provided control voltage.

Figure 6:
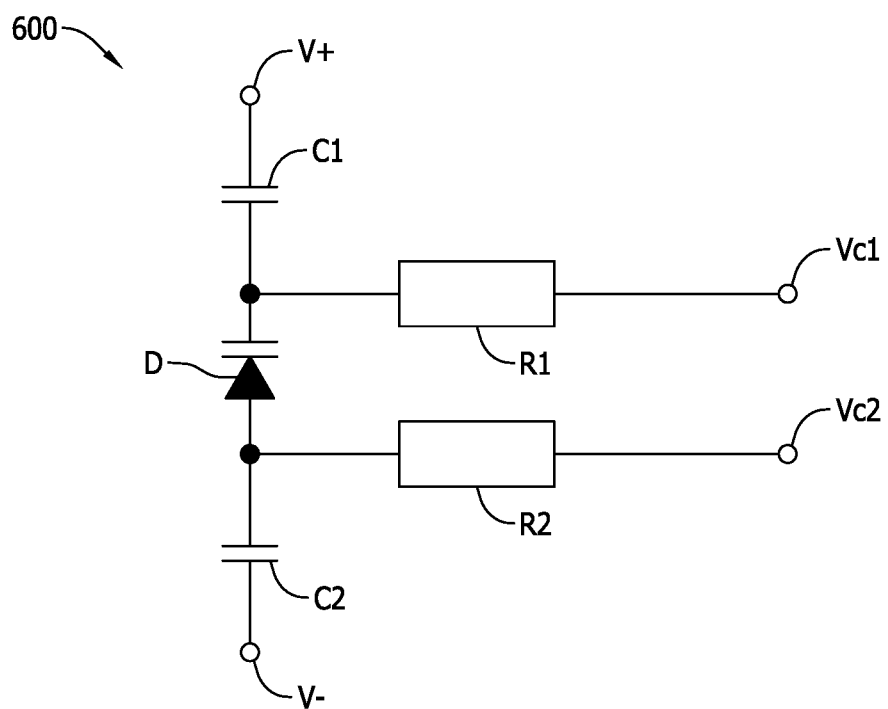
FIG. 6 is a schematic diagram of one embodiment of a varactor.

FIG. 6 is a schematic diagram of one embodiment of a semiconductor varactor 600 for use in a switched capacitor resistor, such as switched capacitor resistor 500 (shown in FIG. 5) and in a capacitance-tuned VCO, such as VCO 250 and VCO 320 (shown in FIGS. 2 and 3). Semiconductor varactor 600 includes a constant capacitor C1, a varactor diode D, and a constant capacitor C2 coupled in series between a voltage V+ and a voltage V−. A first control terminal Vc1 is coupled to the cathode of varactor diode D through an impedance R1. A second control terminal Vc2 is coupled to the anode of varactor diode D through an impedance R2. Semiconductor varactor 600 uses the voltage-dependent capacitance of the reversed-biased p-n junction of varactor diode D to tune to a desired capacitance. The combined effects of voltages V+, V−, and voltages applied at Vc1 and Vc2, facilitate tuning semiconductor varactor 600 by transforming a 2-terminal device in varactor diode D into a 4-terminal device in semiconductor varactor 600. In alternative embodiments, semiconductor varactor 600 utilizes a MOS capacitor with a voltage-dependent capacitance.

Figure 7:
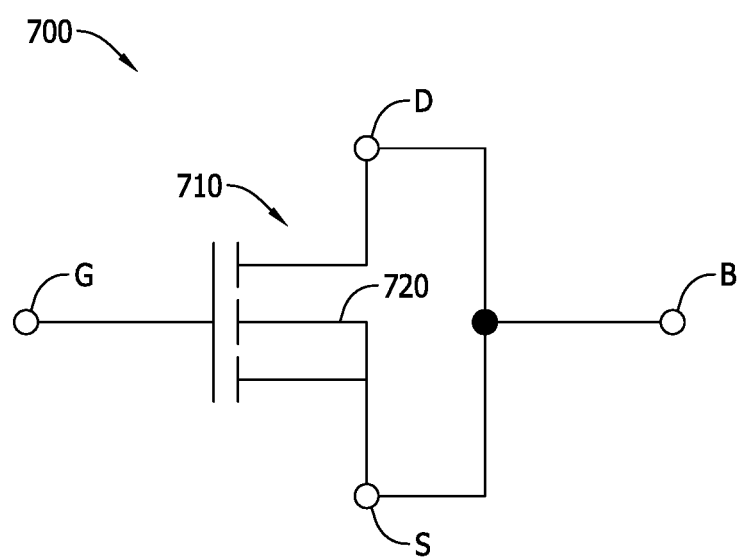
FIG. 7 is a schematic diagram of another embodiment of a varactor.

FIG. 7 is a schematic diagram of another embodiment of a varactor 700 for use in a switched capacitor resistor, such as switched capacitor resistor 500 (shown in FIG. 5) and in a capacitance tuned VCO, such as VCO 250 and VCO 320 (shown in FIGS. 2 and 3). Varactor 700 includes an MOSFET 710 having a gate terminal G, a drain terminal D, a source terminal S, and a body 720. MOSFET 710 is wired as a capacitor by coupling source S and drain D to body 720 and providing a body terminal B. The capacitance of varactor 700 is measured across gate terminal G and body terminal B, and depends on the voltage across those terminals. Body 720 can be implemented with a silicon well of the same or opposite polarity as diffusion/implants of source S and drain D, facilitating operation of MOSFET 710 as an accumulation varactor or an inversion FET capacitor. MOS varactors provide good radiation stability because their channel mobility reduction does not factor at all in the capacitance value.

Figure 8:
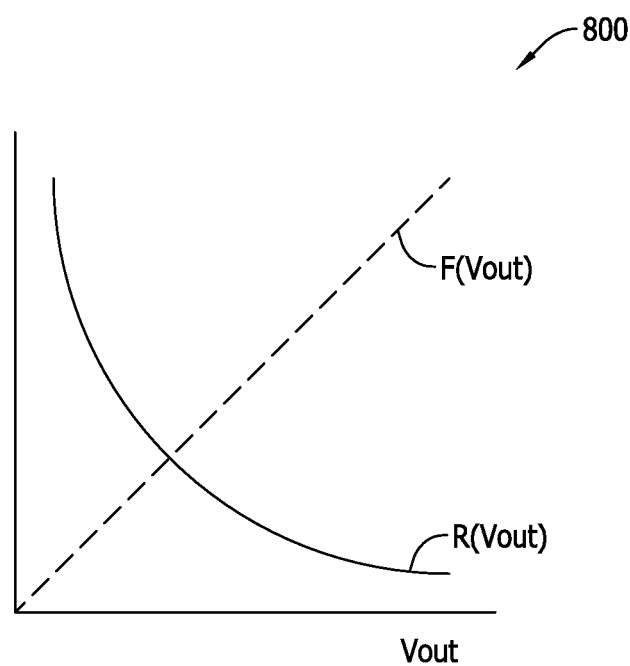
FIG. 8 is a plot of resistance and frequency as a function of an output voltage for one embodiment of stress sensor circuit.

FIG. 8 is a plot 800 of resistance R and frequency F as functions of an output voltage Vout for an exemplary stress sensor circuit, such as stress sensor circuits 100 and 200 (shown in FIGS. 1 and 2) that fall in the first class of embodiments. More specifically, resistance R is that of a switched capacitor resistor, such as switched capacitor resistor 500 (shown in FIG. 5), and frequency F is that of a periodic signal controlling the switching of first MOSFET 520 and second MOSFET 530. The periodic signal, in certain embodiments, is generated by an external precision clock device, such as a VCO or capacitance-tuned VCO.

Frequency F is tuned monotonically based on voltage Vout. Plot 800 illustrates that F increases linearly with Vout. In alternative embodiments, F may increase non-linearly with Vout. Given the hyperbolic R=1/(C·f) relationship for the switched capacitor resistor, in both cases resistance R decreases non-linearly with an increase in Vout.

Figure 9:
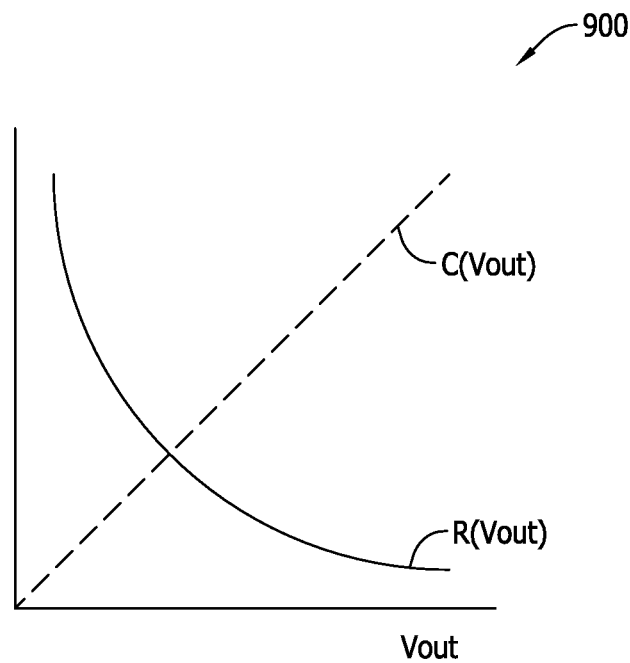
FIG. 9 is a plot of resistance and capacitance as a function of an output voltage for one embodiment of a stress sensor circuit.

FIG. 9 is a plot 900 of resistance R and capacitance C as a function of a reference voltage Vout for an exemplary stress sensor circuit, such as stress sensor circuits 100 and 300 (shown in FIGS. 1 and 3) that fall in the second class of embodiments. More specifically, resistance R is that of a switched capacitor resistor, such as switched capacitor resistor 500 (shown in FIG. 5), and capacitance C is that of a varactor, such as varactor 600 and 700 (shown in FIGS. 6 and 7) for use in switched capacitor resistor 500.

Capacitance C is tuned monotonically based on voltage Vout. Plot 900 illustrates that C increases linearly with Vout. In alternative embodiments, C may increase non-linearly with Vout. Given the hyperbolic R=1/(C·f) relationship for the switched capacitor resistor, in both cases resistance R decreases non-linearly with an increase in Vout.

Figure 10:
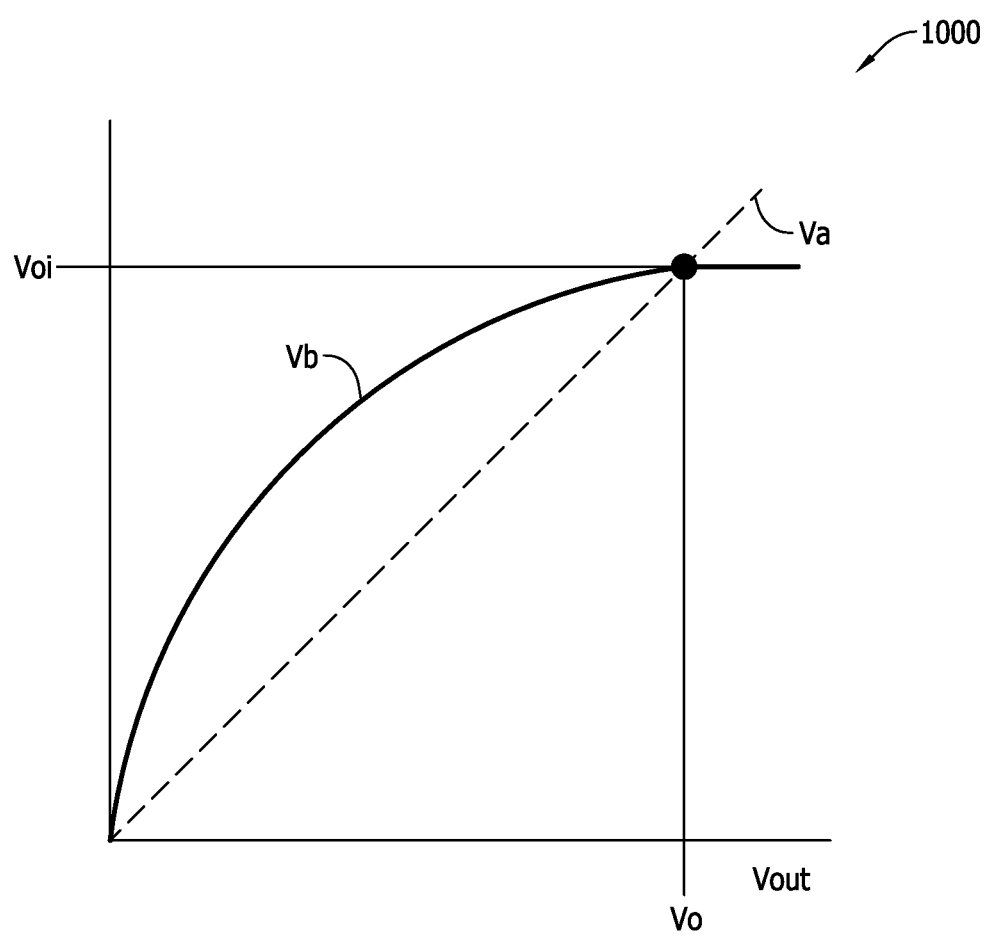
FIG. 10 is a plot of intermediate node voltages as a function of an output voltage for one embodiment of a stress sensor circuit.

FIG. 10 is a plot 1000 of intermediate bridge node voltages for stress sensor circuit 100, or for stress sensor circuits 200, and 300 (shown in FIGS. 1-3). For a bridge circuit coupled between Vout and a ground, GND, such as bridge circuit 110, a voltage Va presents across reference resistance Rtune at first intermediate node 120. Va is a result of a constant voltage division of Vout across tuning branch 112 having resistance R1 and Rtune in series. Similarly, a voltage Vb presents across a switched capacitor resistor having a resistance of Rvar at second intermediate node 130. Vb is a result of a variable voltage division of Vout across variable branch 114 having a resistance R2 and Rvar in series.

Plot 1000 illustrates that voltage Va across Rtune increases linearly with Vout. Plot 1000 also illustrates that voltage Vb across Rvar increases non-linearly with Vout. Plots 800 and 900 illustrate the resistance of a switched capacitor resistor varies inversely and non-linearly with capacitance and frequency. In stress sensor circuit 100, frequency, capacitance, or both are tuned based on Vout itself. Switched capacitor resistor Rvar in bridge circuit 110 likewise varies inversely and non-linearly with Vout. Voltage Vb can therefore be expressed as:

$$Vb = \frac{Vout \cdot R(Vout)}{R1 + R(Vout)}$$

The variation of Vb with decreasing values of R(Vout) diminishes in the segment of Vb illustrated in plot 1000. Amplifier 140 causes bridge circuit 110 to balance voltages Va and Vb, and stress sensor circuit 100 to converge on a single, non-trivial stable Vout, referred to as an equilibrium output, Vo, which is associated with the intersection of Va and Vb to an identical level illustrated as Voi. Convergence on the trivial zero solution is avoided by using a startup circuit to drive the loop of bridge circuit 110 to converge on the non-trivial stable equilibrium voltage output, Vo.

Figure 11:
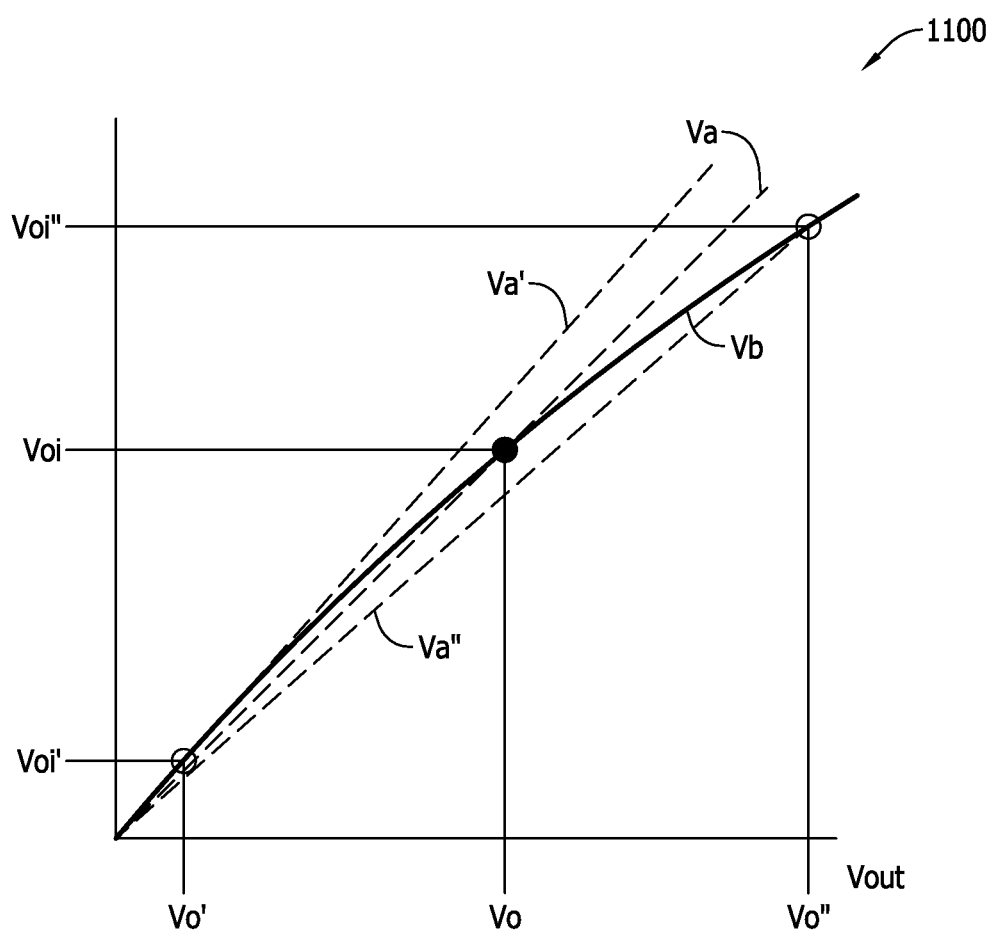
FIG. 11 is a plot of intermediate node voltages as a function of an output voltage for another embodiment of a stress sensor circuit.

FIG. 11 is a plot 1100 of bridge voltages for stress sensor circuit 100, or for stress sensor circuit 400 (shown in FIGS. 1 and 4). For a bridge circuit coupled between Vout and a ground, GND, such as bridge circuit 110, a voltage Va presents across reference resistance Rtune at first intermediate node 120. Va is a result of a constant voltage division of Vout across tuning branch 112 having resistance R1 and Rtune in series. Similarly, a voltage Vb presents across a switched capacitor resistor having a quasi-constant resistance of Rvar at second intermediate node 130. Vb is a result of a quasi-constant voltage division of Vout across variable branch 114 having a resistance R2 and Rvar in series.

Plot 1100 illustrates that voltage Va across Rtune increases linearly with Vout, as in plot 1000. Plot 1100 also illustrates that voltage Vb across Rvar increases quasi-linearly with Vout, because the switched capacitance resistor is tuned to a constant capacitance and switched at a constant frequency, and the sole residual element of dependence on the voltage output is represented by the small residual non-linearities of parasitic elements (such as the junction capacitors of the switches forming the switched-capacitor arrangement). Conversely, plots 800 and 900 illustrate the resistance of a switched capacitor resistor varies inversely and non-linearly with capacitance and frequency. In stress sensor circuits 200 and 300 frequency, capacitance, or both are tuned based on Vout. In stress sensor circuit 400 frequency and capacitance are tuned to yield a quasi-constant Rvar value. Voltage Vb can therefore be expressed as:

$$Vb \cong \frac{Vout \cdot Rvar}{R1 + Rvar}$$

Amplifier 408 causes bridge circuit 402 to balance voltages Va and Vb to a same level Voi, and stress sensor circuit 400 to converge on a single, non-trivial stable equilibrium voltage output, Vo, which represents a nominal state of the bridge before mechanical stresses are applied. The undesirable convergence on the trivial zero solution is avoided by using a startup circuit to drive the loop of bridge circuit 402 to converge on the non-trivial stable equilibrium voltage output, Vo. Given that Va and Vb exhibit similar linearity, small shifts in resistive values within bridge circuit 402, e.g., the resistive values of R1, R2, Rtune, and Rvar, result in large variation of the position of the intersection equilibrium point of Va and Vb, as is illustrated by alternate plots Va' and Va" of, e.g., the voltage at intermediate node 404. Since the equilibrium point deviation univocally depends on the shifts in the elemental resistors determining, e.g., the voltage at intermediate node 404, the equilibrium point deviation manifested at the output node of the bridge is a measure of mechanical stresses applied to the semiconductor wafer or substrate 102, which is reflected by the shifts of the intersection of Va and Vb, into Va' and Vb, or into Va" and Vb: respectively yielding output voltage levels Vo, Vo', and Vo".

Figure 12:
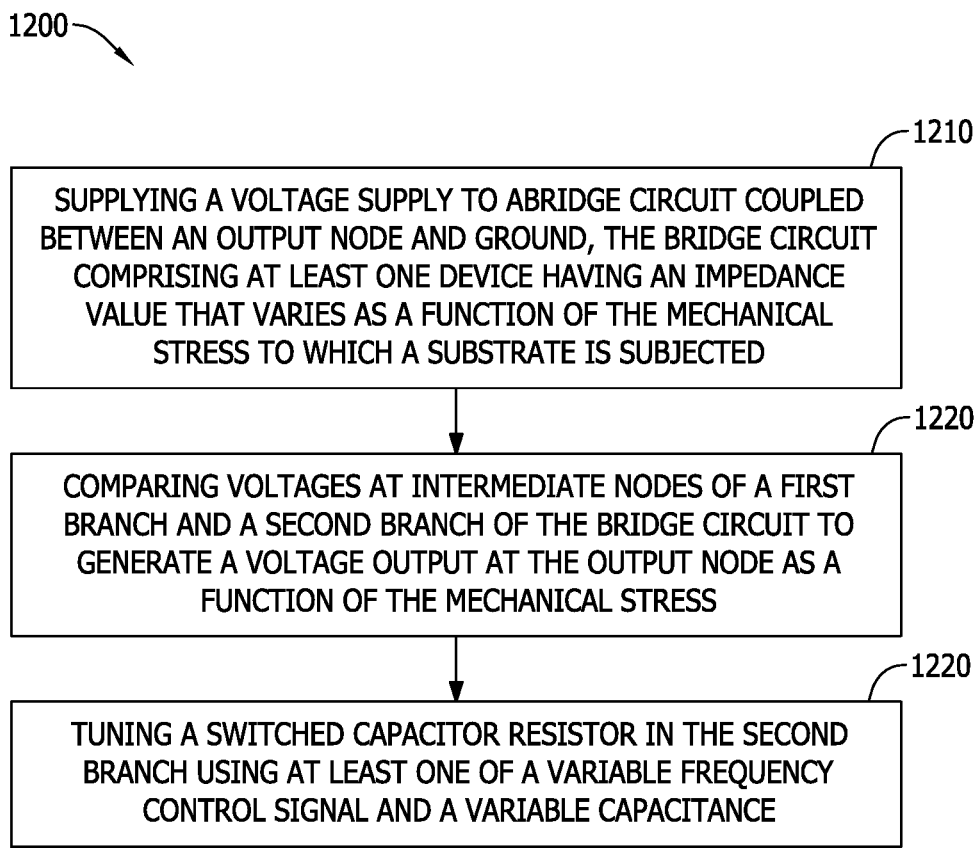
FIG. 12 is a flow diagram of one embodiment of a method of measuring mechanical stress on a substrate.

FIG. 12 is a flow diagram of one embodiment of a method 1200 of measuring mechanical stress on substrate 102, on which bridge circuit 110 is disposed. A voltage supply is supplied 1210 to bridge circuit 110, which is coupled between an output node, Vout, and a ground node, GND. Bridge circuit 110 includes at least one resistor, R1, R2, Rtune, or Rvar, that has a value that varies as a function of the mechanical stress to which substrate 102 is subjected. Voltages, Va and Vb, presented on intermediate nodes 120 and 130 of tuning branch 112 and variable branch 114 are compared 1220 to generate the voltage output at the output node, Vout, as a function of the mechanical stress on substrate 102. Rvar is implemented as a switched capacitor resistor, such as, for example, switched capacitor resistor 500, in variable branch 114. The resistive value of Rvar is tuned 1230 using at least one of a variable frequency signal and a variable capacitance.

In one embodiment, the switched capacitor resistor is controlled by a variable frequency signal, tuned based on the voltage output at the output node, Vout. The capacitor within the switched capacitor resistor is a constant capacitance.

In another embodiment, the switched capacitor resistor includes a varactor tuned based on the voltage output, and is controlled by a constant frequency signal. Similarly, in yet another embodiment, the switched capacitor resistor includes a constant capacitance, and is controlled by a constant frequency signal.

An exemplary technical effect of the methods, systems, and apparatus described herein includes at least one of: (a) adapting a PVR bridge circuit to measure mechanical stresses imparted on the substrate on which the PVR circuit is implemented; (b) improving sensitivity of a stress sensor circuit relative to known rosette and van der Pauw sensing circuits; (c) eliminating the need for a precision current supply for stress sensing circuits; (d) simplifying polling or reading of stress measurements on a voltage output from the stress sensor circuit; (e) simplifying implementation of arrays of stress sensors through use of simple voltage supplies and simplified voltage output from the bridge circuit; and (f) reducing non-linearity of voltage response of a variable resistor in a bridge circuit to improve sensitivity to mechanical stress.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose various embodiments, which include the best mode, to enable persons skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A stress sensor circuit operable to generate a voltage output, comprising:
a substrate configured to be subjected to mechanical stress along at least one dimension; and
a bridge circuit disposed on the substrate and coupled between an output node and a ground node, the bridge circuit comprising:
a first branch having a first resistor of value R1, the first resistor having a first orientation and coupled to a tuning resistor of value Rtune at a first intermediate node,
a second branch having a second resistor of value R2, the second resistor having a second orientation that is different from the first orientation, the second resistor coupled to a variable resistor of value Rvar at a second intermediate node, wherein Rvar is non-linearly tunable based on the voltage output, and
an amplifier having a positive input terminal coupled to the second intermediate node, and a negative input terminal coupled to the first intermediate node, the amplifier configured to generate the voltage output at the output node as a function of the mechanical stress applied to the substrate.

2. The stress sensor circuit of claim 1, wherein at least one of the value R1 of the first resistor, the value Rtune of the tuning resistor, the value R2 of the second resistor, and the value Rvar of the variable resistor are respectively variable as a function of the mechanical stress to which the substrate is configured to be subjected.

3. The stress sensor circuit of claim 1, further comprising a voltage controlled oscillator (VCO) tuned based on the voltage output and configured to generate a variable frequency signal to control the variable resistor, wherein the variable resistor comprises a switched capacitor resistor having a constant capacitance of value C.

4. The stress sensor circuit of claim 3, wherein the constant capacitance comprises a parallel plate capacitor.

5. The stress sensor circuit of claim 3, wherein the amplifier comprises a plurality of metal-oxide semiconductor field effect transistors (MOSFETs).

6. The stress sensor circuit of claim 3, wherein the switched capacitor resistor comprises a semiconductor integrated circuit.

7. The stress sensor circuit of claim 3, further comprising an antenna coupled to the VCO and configured to radiate according to the variable frequency signal generated by the VCO.

8. The stress sensor circuit of claim 1, wherein the first orientation of the first resistor is substantially orthogonal with respect to the second orientation of the second resistor.

9. The stress sensor circuit of claim 1, wherein the variable resistor comprises a switched capacitor resistor having a varactor configured to be tuned based on the voltage output.

10. The stress sensor circuit of claim 9, further comprising an oscillator configured to generate a stable frequency signal to control the switched capacitor resistor.

11. The stress sensor circuit of claim 10, further comprising a phase-lock loop (PLL) circuit driven by the oscillator and configured to replicate the stable frequency signal, wherein the PLL circuit comprises a voltage controlled oscillator (VCO) tunable based on a second varactor of a same type as the varactor of the variable resistor, and wherein the PLL circuit is configured to generate an output voltage for summing with the voltage output.

12. The stress sensor circuit of claim 9, wherein the varactor comprises an electrically-controlled micro-electromechanical system (MEMS) adjustable-plate capacitor.

13. The stress sensor circuit of claim 9, wherein the varactor comprises a metal-oxide semiconductor varactor.

14. The stress sensor circuit of claim 9, wherein the varactor comprises a p-n junction varactor.

15. The stress sensor circuit of claim 1, wherein the variable resistor comprises a switched capacitor resistor having a constant capacitance.

16. The stress sensor circuit of claim 15, further comprising an oscillator configured to generate a stable frequency signal to control the switched capacitor resistor.

17. The stress sensor circuit of claim 1, further comprising a voltage supply configured to power the bridge circuit.

18. A stress sensor array, comprising:
   a voltage supply; and
   a plurality of bridge circuits disposed on respective substrates and coupled between an output node and a ground node, each configured to be subjected to respective mechanical stress along at least one dimension and generate a respective voltage output, and coupled in parallel to the voltage supply, each bridge circuit of the plurality of bridge circuits comprising:
      a first branch having a first resistor having a first orientation and a first value that varies as a function of the respective mechanical stress to which its respective substrate is subjected, wherein the first resistor is coupled to a tuning resistor at a first intermediate node,
      a second branch having a second resistor having a second value and a second orientation that is different from the first orientation, wherein the second resistor is coupled to a variable resistor at a second intermediate node, wherein the variable resistor is non-linearly tunable based on the respective voltage output, and
      an amplifier having a positive input terminal coupled to the second intermediate node, and a negative input terminal coupled to the first intermediate node, wherein the amplifier is configured to generate the respective voltage output at an output node of the bridge circuit as a function of the mechanical stress applied to the substrate.

19. A method of measuring mechanical stress on a substrate, comprising:
   supplying a voltage supply to a bridge circuit coupled between an output node and ground, the bridge circuit comprising:
      a first branch including a first resistor having a first orientation and an impedance value that varies as a function of the mechanical stress to which the substrate is subjected, wherein the first resistor is coupled to a tuning resistor at a first intermediate node,
      a second branch including a second resistor having a second orientation that is different from the first orientation, wherein the second resistor is coupled to a switched capacitor resistor at a second intermediate node;
   comparing voltages at the first intermediate node and the second intermediate node of the bridge circuit to generate a voltage output at the output node as a function of the mechanical stress; and
   tuning the switched capacitor resistor in the second branch, non-linearly, using at least one of a variable frequency signal and a variable capacitance.

20. The method of claim 19, wherein tuning the switched capacitor resistor in the second branch comprises tuning the variable frequency signal based on the voltage output, the variable frequency signal configured to control the switched capacitor resistor.

21. The method of claim 19, wherein tuning the switched capacitor resistor in the second branch comprises:
   supplying a constant frequency signal to control the switched capacitor resistor; and
   tuning the variable capacitance based on the voltage output.

22. The method of claim 19, wherein tuning the switched capacitor resistor in the second branch comprises:
   supplying a constant frequency signal to control the switched capacitor resistor; and
   tuning the variable capacitance formed by a main constant capacitance and ancillary parasitic capacitance within the switched capacitor resistor based on the voltage output.

\* \* \* \* \*